United States Patent
Ho et al.

(10) Patent No.: US 6,760,349 B1
(45) Date of Patent: Jul. 6, 2004

(54) MULTIPLEXER WITH CHANNEL SECTIONING, SELECTIVITY ACTUATED CURRENT SOURCES, AND COMMON-BASE AMPLIFIERS

(75) Inventors: Peter Ho, Union City, CA (US); Graham M. Flower, San Jose, CA (US); Richard C. Walker, Palo Alto, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 751 days.

(21) Appl. No.: 09/654,635

(22) Filed: Sep. 5, 2000

(51) Int. Cl.[7] .................................................. H04J 3/02
(52) U.S. Cl. ...................................... 370/537; 327/407
(58) Field of Search ................................ 370/532, 537; 327/407, 408, 409, 410, 411, 412, 413, 99

(56) References Cited

U.S. PATENT DOCUMENTS 6,211,721 B1 * 4/2001 Smetana ..................... 327/407
6,239,646 B1 * 5/2001 Navabi et al. ............... 327/407
6,385,214 B1 * 5/2002 Kikuchi et al. .............. 370/537

* cited by examiner

*Primary Examiner*—Chi Pham
*Assistant Examiner*—Derrick W Ferris

(57) ABSTRACT

A multiplexer for use with switching apparatus for data communication networks. The multiplexer topology includes two or more groupings, or sections, each containing a plurality of individual channels. Each of the channels has an input buffer amplifier and an output Ft-doubler circuit. The outputs of all of the channels within a each particular channel section are connected in parallel relation, and fed to respective common-base transistor amplifiers. The outputs of all of the common-base amplifiers for each channel section, in turn, are connected in parallel and fed to the inputs of a pair of emitter-follower amplifiers. Through the use of selectively actuated current sources, each multiplexer channel is normally biased off, unless that channel is selected for a switching operation. Bleeder current sources are applied to the emitters of the common-base amplifiers to reduce output jitter from the channels which are biased off. The multiplexer architecture provides high speed operation from channel sectioning, and low power consumption by reducing both the amount of current drawn and the voltage potential necessary, to operate the multiplexer.

22 Claims, 4 Drawing Sheets

MULTIPLEXER WITH CHANNEL SECTIONING, SELECTIVITY ACTUATED CURRENT SOURCES, AND COMMON-BASE AMPLIFIERS

BACKGROUND OF THE INVENTION

1. Field of the Invention

The invention relates generally to multiplexers for use in switching apparatus for communication networks. More specifically, the invention pertains to a high speed, low power consumption, multiplexer, or MUX, including a plurality of inputs and means to route an incoming electrical signal to a single output. The MUX has a circuit topology which includes groupings, or sections, of a plurality of individual multiplexer channels, controlled by selectively actuated current sources. The outputs of the channels within each channel section are connected in parallel relation, feeding a respective pair of common-base amplifiers. The outputs of these common-base amplifiers, in turn, are connected in parallel, to provide a single output channel.

2. Description of the Prior Art

Multiplexers are commonly used in a crosspoint switch device to route data signals from any of a plurality of selected input ports to a selected output port, or to a selected plurality of output ports. The typical circuit topology uses a plurality of 2 to 1 or 4 to 1 multiplexers, of a sufficient number to provide the desired total number of inputs. Thus, for example, a MUX array having 60 inputs and 1 output would include a first bank of fifteen, 4 to 1 input multiplexers. This would provide the required total of 60 input ports. The fifteen outputs of the bank of input multiplexers are then fed to the inputs of a second bank of four, 4 to 1 intermediate multiplexers. The last input of the fourth intermediate multiplexer is unused. Finally, the four outputs of the bank of intermediate multiplexers are fed to the inputs of a single, 4 to 1 output multiplexer, having one output channel. To expand this basic MUX array to provide a crosspoint switch with 60 input channels and 60 output channels, sixty of these MUX arrays would be required. The respective inputs of these arrays would be connected in parallel, and their outputs would remain discrete. Even the relatively simple, 60 to 1 MUX array just described uses a total of twenty individual multiplexers. One consequence of this traditional design is high power consumption, as the control circuitry for actuating individual channels within each bank of multiplexers requires relatively high voltages to operate, typically 3.3 volts. The conventional channel selection circuit uses a differential pair of switching transistors. These transistors redirect the output of a single current source within each multiplexer bank to the proper circuit channel. With this arrangement, every time the number of input channels is doubled, a higher supply voltage must be used. If the supply voltage could be reduced, it would result in lower power consumption and less heat dissipated by the MUX.

It should also be noted that the three stage design results in more signal jitter, or time-based waveform distortion, as each signal must be routed through three multiplexers in passing from the input to the output. Of course, any distortion of the signal waveform as consequence of passing through a multiplexer is undesirable.

Consequently, the need exists for a multiplexer which reduces the number of circuit channels which must be instantaneously operative to route a signal.

The need also exists for a multiplexer which maintains high speed operation yet provides a reduction in the overall power consumed by the multiplexer.

The need also exists for a multiplexer using a circuit topology with reduced parasitic capacitance, to provide an increase in operational speed for a given size of a multiplexer, or to maintain the same operational speed with an increase in the size of the multiplexer.

The need also exists for a multiplexer exhibiting reduced signal jitter over prior art designs, for a given size of the multiplexer.

SUMMARY OF THE INVENTION

The multiplexer, or MUX, of the present invention is comprised of a plurality of discrete, independently powered, channel sections. Each channel section, in turn, includes a plurality of individual channels, each preferably having an input buffer amplifier and an output Ft-doubler amplifier. Differential circuitry is used for both the buffer and the doubler amplifiers.

The components of each channel are powered by switchable bias current sources which are selectively actuated by a decoder. Only the current sources for the channel selected to route the signal are activated at any given moment. Thus, the channels which are not in use for routing a signal are biased off to save power and reduce dissipated heat.

The differential outputs of the channels within each channel section are connected in parallel, and fed to a pair of common-base amplifiers. Bleeder current sources are connected to the emitters of the common-base amplifiers to stabilize the quiescent state of the amplifiers. This effectively reduces signal jitter for the data passing through the multiplexer, and increases the speed performance of the multiplexer.

The outputs of common-base amplifiers of each channel section are connected in parallel, and may optionally be wired to the inputs of a pair of emitter follower amplifiers, for additional gain through the multiplexer. The outputs of the emitter follower amplifiers then constitute the outputs of the multiplexer.

The ratio of the number of common-base amplifiers to the number of channels within each channel section bears a predetermined relationship. This ratio affects the speed performance of the multiplexer. If the ratio is too low, say 1 to 60 (0.0167), the array will be unacceptably slow in signal routing operations. If the ratio is higher, on the order 6 to 10 (0.60), the speed of the multiplexer will be perfectly acceptable. Ratios between these upper and lower ratios may be acceptable or unacceptable, depending upon the particular application.

Arranging the channels into groups or sections reduces the parasitic capacitance which would otherwise result from a single, large scale parallel connection arrangement of the channel outputs. The lowered parasitic capacitance allows higher speed operation for a given array size.

Using individual current sources to power each individual channel reduces the consumption of power in two ways. First, only one current source is activated at a time to select the desired input channel. Thus, irrespective of the size of the MUX, only one bias current is activated at any moment when a signal is routed. Second, a lower voltage may be used to power the channels, as the prior art differential switch is replaced with a decoder, which only turns on the current source for the selected channel. Using this arrangement, the operating voltage is reduced and it does not need to be increased for a multiplexer with a larger number of inputs.

These and other objects and features of the present invention will become apparent in the detailed description and the accompanying drawings to follow.

DETAILED DESCRIPTION OF THE PREFERRED EMBODIMENT

Figure 1:
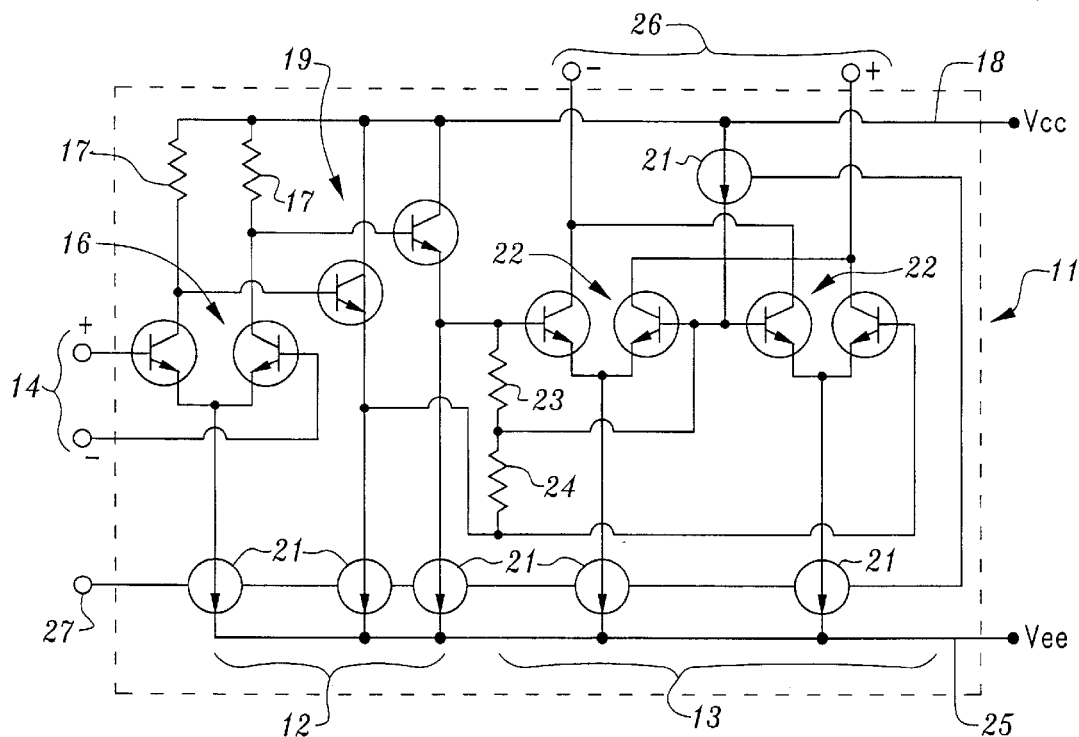
FIG. 1 is a circuit schematic of a single channel, used in the MUX of the present invention.

Turning now to FIG. 1, the circuit of a single channel 11 includes an input buffer 12 and an output Ft-doubler 13. The input buffer 12 has the primary functions of reducing crosstalk, reshaping weak input signals, and then amplifying the signals to proper levels for the subsequent stage, the Ft-doubler 13. Doubler 13 is effective to reduce the loading at the output of the buffer, so the buffer will remain effective in amplifying input signal of higher frequencies. Doubler 13 also provides a more balanced waveform for the signal outputted from channel 11.

Buffer 12 is of differential circuit topology, having an input 14 connected to a first pair of transistors 16, and having load resistors 17 connected to supply voltage 18, or Vcc. The second stage of the buffer 12 includes a second pair of transistors 19. A plurality of switchable bias current sources 21, connected to ground 25, or Vee, control operating parameters for the buffer 12. These switchable current sources may be implemented through the use of switching transistors and resistors, but other controllable bias schemes, well known to those of ordinary skill in the art, may be used as well.

Two pairs of transistors 22 continue the differential circuit topology in Ft-doubler 13. Resistors 23 and 24 provide a voltage divider for the doubler bias, and switchable current sources 21 actively control the doubler's operation. Ft-doubler 13 includes an open collector output 26, through which the amplified input signal passes. The high characteristic impedance of the open collector output circuitry of doubler 13 allows the outputs of a plurality of channels to be connected in parallel. It should also be noted that in particular applications, Ft-doubler 13 may simply be replaced with another buffer stage using an open collector output configuration.

A select line 27, in combination with switchable bias current sources 21, provides an important operational feature of the multiplexer 28, or MUX of the present invention. The current sources 21 of a particular channel 11 are turned on or off by a signal at its select line 27 input, depending upon whether that channel is selected for passing input data to the channel output. As will become more apparent herein when the operation of a plurality of channels is discussed, the ability selectively to turn channels on or off provides considerably lower power consumption than prior art devices of similar speed performance and functionality.

Figure 2:
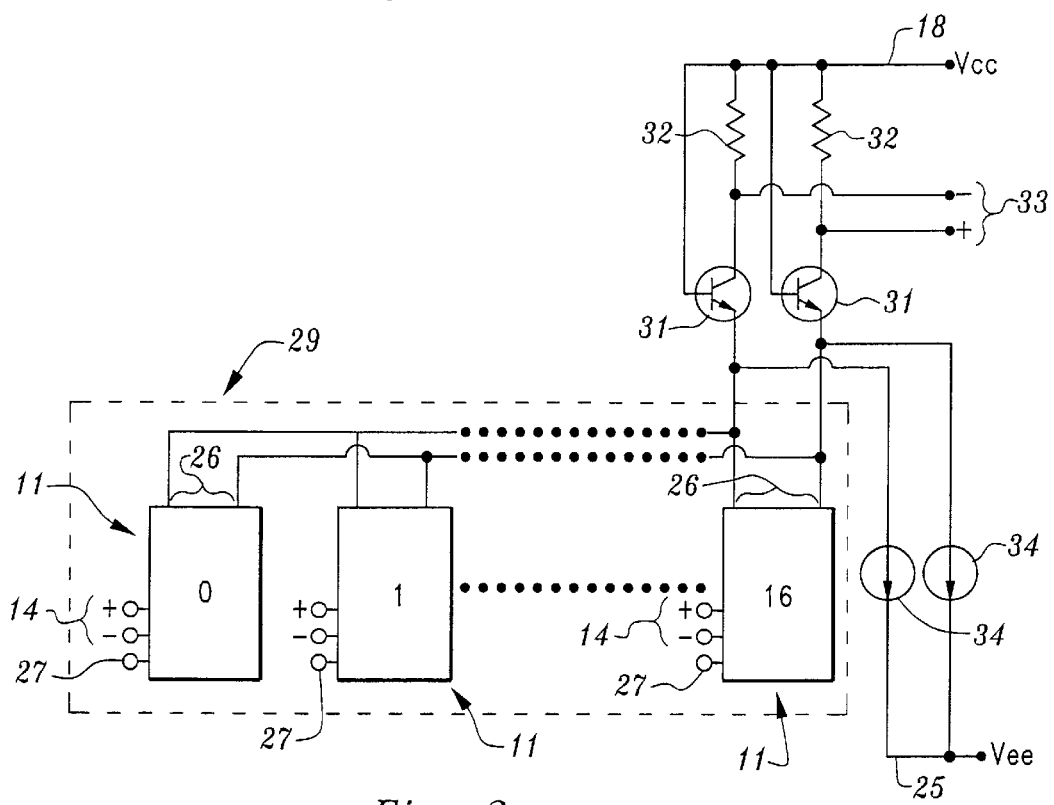
FIG. 2 is a block diagram a channel section including a plurality of the individual circuit channels shown in FIG. 1.

Making particular reference now to FIG. 2, a plurality of channels 11 is assembled to form a channel section 29. Channel sections 29 effectively break up a large multiplexer circuit into smaller parts so that the parasitic capacitance which would otherwise result from a large assemblage of channels, is reduced. Owing to the reduction of parasitic capacitance, the speed of the multiplexer 28 is increased. Alternatively, such a circuit topology allows the same speed to be maintained, even though the multiplexer is made larger. In the particular embodiment of the invention disclosed herein, a total of seventeen channels (numbered 0–16) are included within each channel section 29. Of course, if a different number of input channels were desired, then the number of channels within a section, or the number of channel sections may be changed to suit the specifications of the application.

The outputs 26 of each of the channels 11 are connected in parallel. As was mentioned previously, the high impedance open collector output configuration of Ft-doubler 13 allows such a connection. The paralleled output lines, in turn, are connected to respective emitters of a pair of common-base amplifiers 31. The bases of amplifiers 31 are directly connected to Vcc, whereas their collectors are connected to Vcc through load resistors 32. The channel section output 33 is taken off the collector end of load resistors 32.

Common-base amplifiers 31 provide a number of important advantages in this circuit configuration. The sectioning of the channels, as discussed above, provides reduced parasitic capacitance, and therefore enhanced speed performance. But common-base amplifiers also have a characteristic low-impedance input which reduces circuit impedance and the voltage swing at the collector of each channel's differential pair of output transistors. This latter effect itself, as will be shown in FIG. 7, increases the speed performance of the MUX, even without the benefit of the channel sectioning.

For the purpose of reducing time-based distortion of the input signal, otherwise known as signal jitter, low level bleeder current sources 34 are provided at the emitters of the common-base amplifiers 31. Signal jitter occurs as a consequence of the difference in the amount of voltage settling that occurs at the base-emitter junction of a common-base transistor which is biased off. Since there is no current flowing through that junction at cutoff, the voltage across that junction will collapse at a logarithmic rate. Thus, different data length and different frequency of channel selection will effect uneven and inconsistent amplifier operation, depending upon where in the logarithmic curve the amplifier is turned on again.

A bleeder current establishes a minimum base-emitter junction voltage, beyond which that voltage will not fall. The amount of bleeder current is selected so that the settling voltage for the longest signal is the same as that for the shortest signal. In effect, this is the same current which will ensure that the shortest signal settles the junction voltage to a final value. For a circuit which is not fast enough to produce a substantially square wave, bleeder current can still be used to bring the final settling voltage to the same value as for a single bit of data. Thus, the slower the circuit, the greater efficacy of the bleeder current in reducing jitter.

Figure 6A:
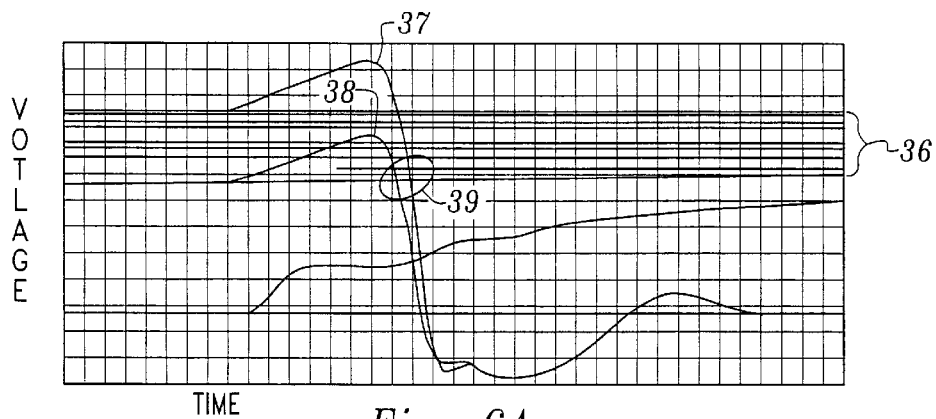
FIG. 6A is a diagram showing the waveforms of two signals sampled at the emitter of a common-base amplifier without bleeder current applied.
Figure 6B:
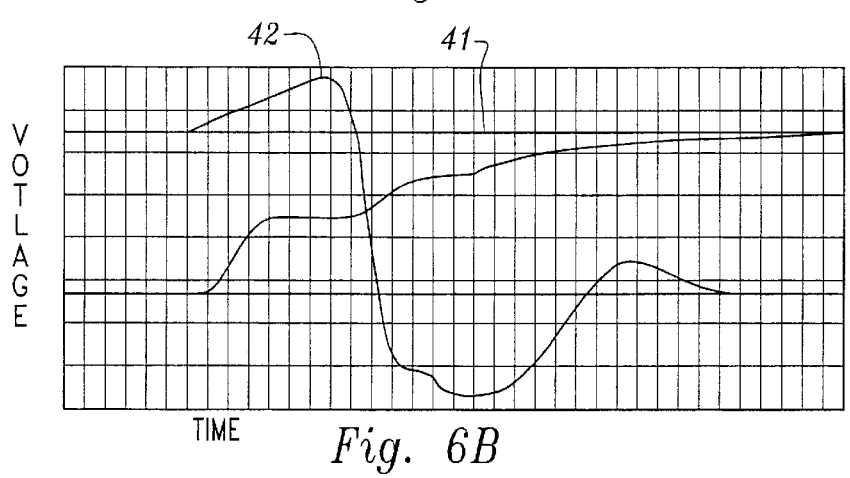
FIG. 6B is a waveform as in FIG. 6A, but with bleeder current applied to the emitter; and, FIG. 7 is an eye diagram of various waveforms sampled at the load resistor of the MUX, illustrating the effect different ratios for the number-of-common-base-circuits to the number-of-channels-per-common-base-section.

FIG. 6A shows the effect of different settling voltages 36 upon successive waveforms 37 and 38 of the same signal, with no bleeder current being applied to the emitter of a common-base amplifier. The data rate of the signal is 3.125 Gbps (Giga bits per second), fed through a circuit with a transistor Ft of 45 Ghz. By comparing the temporal offset between waveforms 37 and 38 in the region 39 encompassed by the circle, the effect of different settling voltages can graphically be appreciated. In FIG. 6B, the effect of applying a bleeder current of 1.07% of bias current to the emitter of the common-base amplifier 31 is shown. Of course, the precise relationship between the appropriate amount of bleeder current and the amplifier bias will vary from circuit to circuit, but the parameters of proper operation will stay the same. The bleeder current establishes a substantially constant settling voltage 41, with the result that waveform 42 produces substantially a coincident, repeatable representation on the graph.

Figure 3:
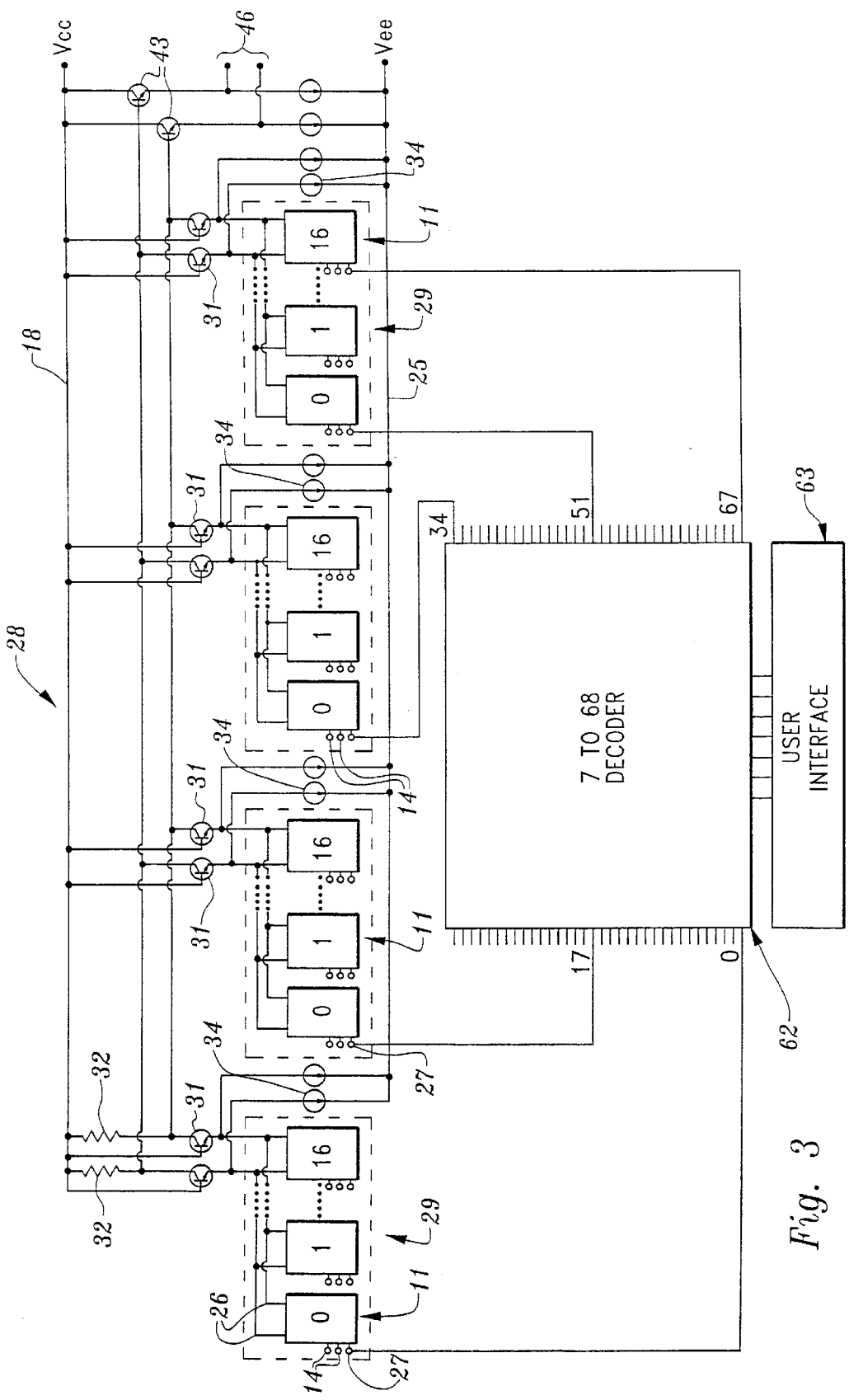
FIG. 3 is a block diagram of a 68 channel MUX, built in accordance with the teachings of the present invention.

Turning now to FIG. 3, a simplified schematic of the multiplexer 28, or MUX of the present invention is shown. It should be noted that this schematic only shows one "layer" of a complete 68×68 crosspoint switch, which would require an overlay of 68 of the circuits represented in FIG. 3. In other words, the simplified form of the schematic of the MUX 28 shown in FIG. 3 has 68 inputs but only 1 output. Thus, to provide 68 separate outputs, in a 68×68 crosspoint switch application for the MUX, this circuit would have to be duplicated 68 times, with all of the respective input circuits 0–67, connected in parallel, and all of the output circuits maintained as discrete. Because an entire schematic representation of a 68×68 crosspoint switch would be unduly complex and merely repetitive of that which is already shown in FIG. 3, and FIG. 3 is an adequate disclosure for one of ordinary skill in the art to understand the basic components and circuitry of the MUX. And, because those of ordinary skill in the art will understand how to implement a crosspoint switch application for the MUX, no effort will be made to show an entire schematic for a 68×68 crosspoint switch.

FIG. 3 clearly shows the multiple channel sectioning feature of the present invention. This embodiment of the invention shows a total of four channel sections 29, each of which includes 16 individual channels. As discussed previously, the differential outputs of the channels within each section are connected in parallel and fed to respective pair of common-base amplifiers 31. The outputs of each of the pairs of common-base amplifier are connected in parallel, as well Load resistors 32 are provided, extending between these paralleled outputs of the common-base amplifiers and Vcc 18. The paralleled outputs are also fed to respective bases of emitter follower amplifiers 43. Current sources 44 provide bias for amplifiers 43, and the differential multiplexer output 46 is taken off the emitters of amplifiers 43.

Figure 5:
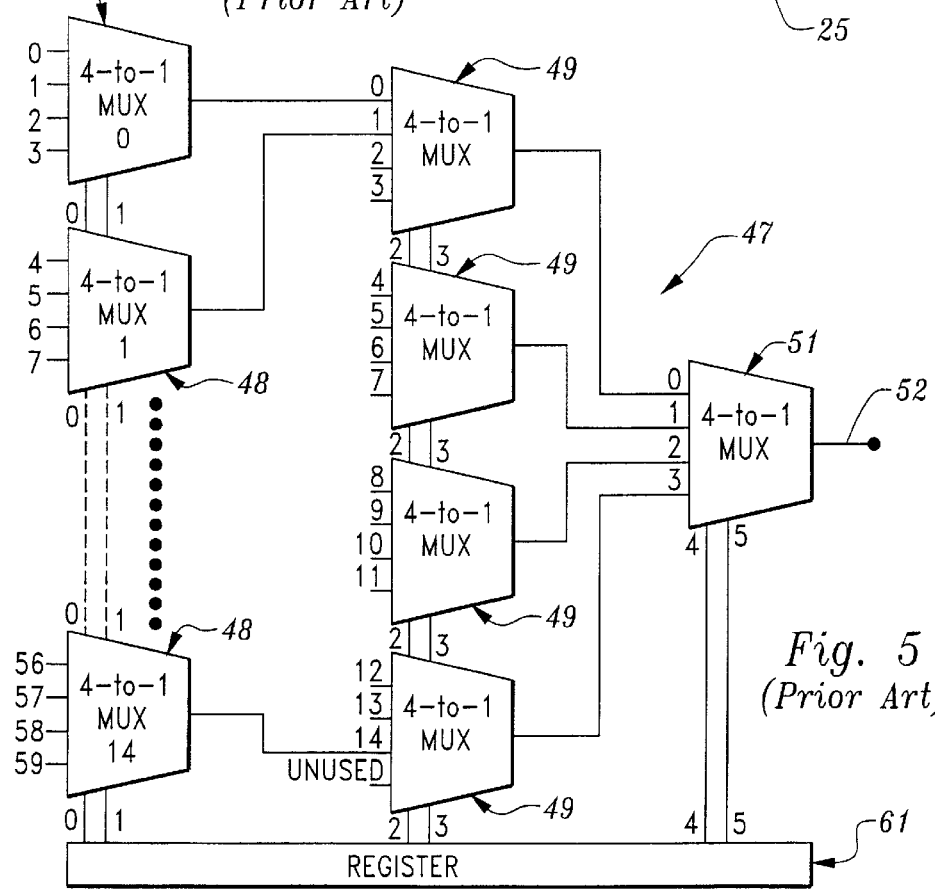
FIG. 5 is a schematic of a prior art 60 to 1, MUX array.

The use of multiple channel sections in the present MUX, wherein each section includes a plurality of individual channels, reduces the number of multiplexer stages through which a routed signal must pass. This is to be contrasted with a prior art MUX array 47, shown in FIG. 5, which includes three series-connected, multiplexer banks or stages, having a total of twenty, 4 to 1 multiplexers. It should be understood that the MUX array 47 in FIG. 5 is only one "layer" of a complete crosspoint switcher, which is a typical use or application for multiplexers. However, for the same reasons set forth above, no attempt will be made to show the entire schematic for a prior art crosspoint switcher. Nevertheless, the basic circuit topology of such a multiple-stage prior art MUX will be evident from the example shown in FIG. 5.

And from examining this topology, the path of signal routing through the MUX 47 will be evident as well.

A typical prior art 60 to 1 MUX array would include a first bank of fifteen, 4 to 1 input multiplexers 48. This will provide a total of 60 input ports (0–59). It is understood that each of the inputs and outputs of the multiplexers actually has two circuit connections, but for purposes of simplifying the schematic, they are shown as a single circuit connection in FIG. 5. The fifteen outputs of the first bank of input multiplexers are then fed to the respective inputs of a second bank of four, 4 to 1 intermediate multiplexers 49. The last input of the fourth intermediate multiplexer 49 is unused. Finally, the four outputs of the second bank of intermediate multiplexers are fed to respective inputs of a single, 4 to 1 output multiplexer 51, having one output channel 52.

A signal passing through MUX array 47 will necessarily have to pass through three multiplexer stages, before being routed to output 52. Because each multiplexer has the potential of adding jitter to the routed signal, array 47 exhibits a higher amount of jitter than the multiplexer 29 of the present invention. However, as the MUX 29 of the present invention uses a plurality of individual channels, the signal is routed through only a single channel before reaching the multiplexer's output. Thus, the channel sectioning arrangement of present invention provides reduced signal jitter, when compared to the multiple-staged MUX array 47 of the prior art.

Figure 4:
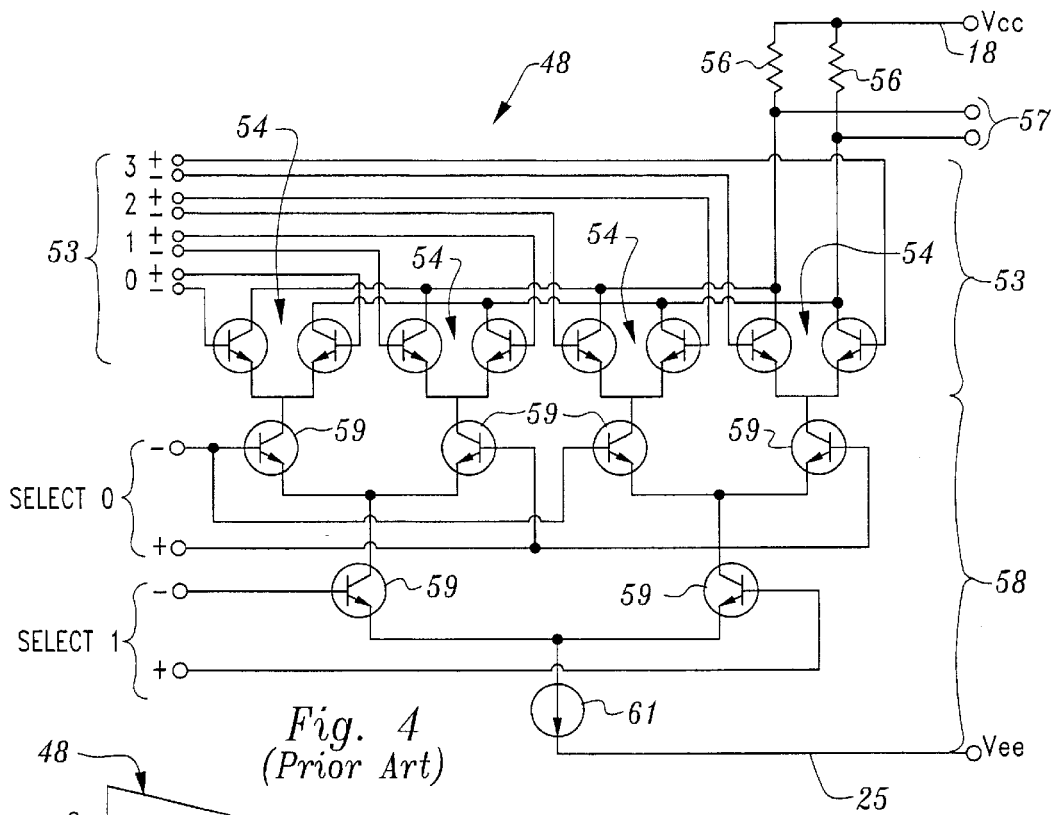
FIG. 4 is a schematic of a prior art 4 to 1 MUX.

All of the multiplexers 48, 49, and 51 are identical in construction. Therefore, the detailed schematic description of multiplexer 48 shown in FIG. 4 applies to all of the 4 to 1 multiplexers used in the MUX array 47. The multiplexer 48 includes an input stage 53, having input pairs of transistors 54 connected in differential fashion. The bases of each respective pair of transistors 54 are connected to differential inputs 0–3, and the collectors of transistors 54 are connected in parallel to form an output circuit. Load resistors 56 interconnect output 57 with Vcc 18.

A channel selector 58, includes transistors 59 and current source 61. Selector 58 also has select inputs 0 and 1, interconnected to transistors 59 to effect differential switching of transistors 54. As shown in FIG. 5, select lines 0 and 1 are connected respectively to select inputs 0 and 1 of each multiplexer 48. This, in effect, connects all of the 0 and 1 inputs of multiplexers 48 in parallel. Similarly, select lines 2 and 3 are connected to select inputs 2 and 3 of multiplexers 49, and select lines 4 and 5 are connected to select inputs 4 and 5 of multiplexer 51. Select lines 0–5 are also connected to register 61, having a six-bit address. By sending bits to the proper select inputs, the output of current source 61 is fed to the selected pair of transistors 54, and the signal is thereby routed through the MUX array 47. Because the select inputs are connected in parallel, this arrangement activates multiplexer channels which are not used and thereby consumes more power than is necessary. In addition, this arrangement relies upon a single current source for each multiplexer, and the transistors 59 which direct the power for this single current source require progressively higher power to operate as the size of the array increases.

The channel selector circuitry for the MUX 28 of the present invention operates on a significantly different principle than the prior art device just described. Each separate channel 11 has its own dedicated select line input 27 which determines whether or not the current sources 21 within that channel are actuated or not. As shown in FIG. 3, a 7 to 68 decoder 62 includes select lines 0–67, each being connected to a respective select line input 27 for an individual channel 11. Decoder 62 includes CMOS logic, which exhibits low power consumption and requires only a single select line, as opposed to the pair of differential lines used in the prior art channel select system. A user interface 63, including a 7-bit register, is interconnected to decoder 62. In this way, the user may select a signal present at any input to be routed to any selected output.

The use of selectively actuated individual current sources for each channel of the MUX 28 provides the advantages of low power consumption and low voltage operation. The low power consumption feature results from having only one current source on at a time, to select the desired input channel. Even with larger MUX circuits, the power consumption for this aspect of MUX operation does not increase. Low voltage operation results from using the CMOS decoder, which is called upon to turn on only the current source for the desired channel. Even if the size of the multiplexer is increases, no higher voltage will be required to operate the channel select system. The prior art multiplexer design requires a higher select supply voltage every time the number of input channels is doubled. This higher voltage results in more heat to be dissipated, and the attendant operational problems and circuit complexity resulting therefrom.

Figure 7:
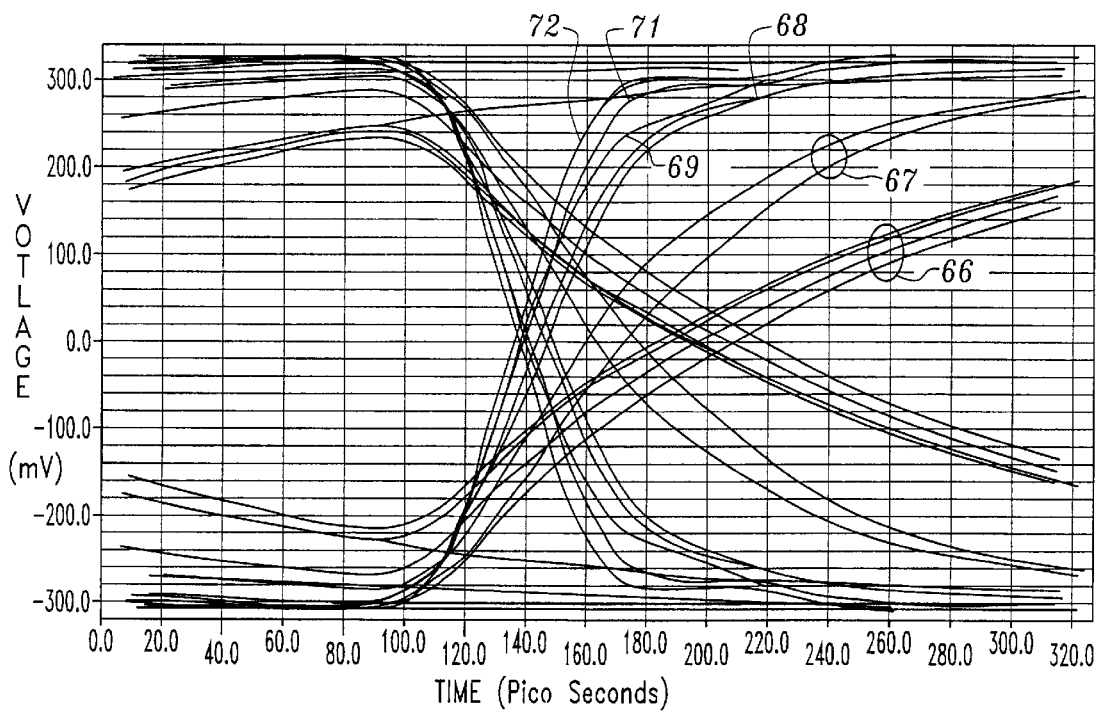

Turning now to FIG. 7, an eye diagram which compares the effect of different ratios between the total number of channel sections to the number of channels within each section is shown. One conclusion which may be drawn from this diagram, is that there are predetermined section/channel ratios which are preferable, and there are other section/channel ratios which should be avoided. Another conclusion which may be drawn is that the use of common-base amplifier circuits in a multiplexer will increase speed performance even without the use of a plurality of channel sections. Yet another conclusion which will be evident from the diagram is that the combination of an intermediate section/channel ratio with the use of common-base amplifier circuits will provide the best speed performance for a multiplexer of the present design. Although this eye diagram represents testing conditions for a sixty channel multiplexer, the results are applicable to the performance of the preferred embodiment, which has sixty-eight channels.

It is evident that the section/channel ratio significantly affects the speed performance of the multiplexer. The ratio affects the speed of the multiplexer, in that the signal rise and fall times at the outputs of each section should closely track the signal rise and fall times at the multiplexer load resistors. This relationship may alternatively be expressed as follows:

$$\frac{\text{Number of Sections}}{\text{Number of Channels Per Section}} \approx \frac{\text{Impedance at Emitter Of Common-Base Amplifier}}{\text{Impedance At Load Resistor}}$$

$$\frac{\text{Number of Sections}}{\text{Number of Channels Per Section}} \approx \frac{\text{Voltage Swing At Emitter of Common-Base}}{\text{Voltage Swing At Load Resistor}}$$

The worst performance is represented in the region 66, in which no common-base amplifiers and no channel sectioning technique were employed. The groups of signals included within region 66 are time skewed by the slow performance of the multiplexer, and also exhibit considerable signal jitter. Increased speed is exhibited by the signals within region 67. In this instance, a single common-base amplifier was used in conjunction with a sixty channel multiplexer (1:60 ratio). Even though no channel sectioning was employed, the use of this single amplifier noticeably increased the multiplexer's speed.

A circuit/section ratio of 2:30, is represented by lines 68. This also shows increased speed, although the performance is still far from optimum. Line 69 shows the further increase in speed achieved by a ratio of 10:6. Line 71 illustrates even better performance, resulting from a ratio of 3:20. The last group of lines, identified by the numeral 72, exhibits best performance, and includes the very closely matched ratios of 4:15, 5:12, and 6:10. By taking into consideration this information, multiplexers of different sizes may be designed, taking into consideration the number of input channels desired, which in turn affects the optimum number of common base circuits and the number of channels within each common-base channel section.

There are other implementations of the invention which should be mentioned, as well. The channel sectioning taught herein with the use of common-base amplifiers may also be carried out using MOS devices. In that circumstance, the common-base amplifiers become common-gate amplifiers using MOS transistors. The technique of circuit or channel sectioning, used to divide parasitic capacitance, may be expanded. This would be accomplished first by dividing up the channels into smaller sections, and segregating these sections into two or more section banks. Then, the paralleled outputs of the common-base amplifiers for each bank would be fed to additional respective pairs of common-base amplifiers. Then, the outputs of this secondary group of common-base amplifiers would be connected in parallel to the load resistors. Additional speed and power reduction for a given MUX size, will be achieved. Even though further division of the channels will require a higher supply voltage, this may be an acceptable compromise.

It will be appreciated, then, that we have disclosed a multiplexer exhibiting improved performance through the use of channel sectioning, selectively actuated current sources for powering individual channels, and common-base amplifiers selected and numbered to match the impedance and voltage swings at the output load resistors of the multiplexer.

What is claimed is:

1. A multiplexer for routing electrical signals, comprising:
  a. at least first and second channel sections, each of said channel sections having a plurality of channels for routing a signal from a respective channel input to a respective channel output, each of said channel outputs from said first and second channel sections being respectively connected in parallel;
  b. means for selecting a particular said channel within said first or said second channel section, and routing an electrical signal delivered to its channel input to its channel output; and,
  c. at least first and second pairs of common-base amplifiers, said first pair of common-base amplifiers having emitter inputs connected to said parallel outputs of said first channel section, and said second pair of common-base amplifiers having emitter inputs connected to said parallel outputs of said second channel section, said first and second pairs of common-base amplifiers having respective collector outputs, said outputs of said first and second common-base amplifier outputs being connected in parallel to provide a multiplexer output.

2. A multiplexer as in claim 1, further including means for reducing signal jitter at said emitter inputs of said first and second pairs of common-base amplifiers.

3. A multiplexer as in claim 2 in which said means for reducing jitter comprises a bleeder current source which establishes a minimum base-emitter junction voltage for said common-base amplifiers.

4. A multiplexer as in claim 3 in which said minimum base-emitter junction voltage is selected so that a settling voltage for an electrical signal of long duration is substantially the same as that for an electrical signal of short duration.

5. A multiplexer as in claim 1 in which said outputs of said common-base amplifiers are connected to a pair of emitter-follower amplifiers.

6. A multiplexer as in claim 1 in which a predetermined ratio exists between the number of said common-base transistors and the number of channels in each said channel sections, said predetermined ratio being selected so that the ratio of said common-base amplifiers for a channel section to the number of channels within said channel section, is approximately the same as the ratio between an impedance at said emitter input of said common-base amplifiers to an impedance at said output of said common-base amplifiers.

7. A multiplexer as in claim 6 in which said ratio is selected to fall within a range of 4:15, 5:12, or 6:10.

8. A multiplexer as in claim 1 in which said means for selecting a particular said channel within said first or said second channel section includes a plurality of switchable current sources within each of said channels.

9. A multiplexer as in claim 8 in which each of said switchable current sources within each of said channels is interconnected to a respective select line input, and further including a decoder having a plurality of outputs connected to each of said respective select line inputs.

10. A multiplexer as in claim 1 including four of said channel sections, and in which each of said channel sections includes seventeen of said channels.

11. A multiplexer as in claim 1 in which at least one of said channels includes an input buffer and an output Ft-doubler.

12. A multiplexer for routing electrical signals, comprising:
 a plurality of channel sections, each of said channel sections having a plurality of channels for routing a signal from a respective channel input to a respective channel output, each of said channel outputs from said plurality of channel sections being respectively connected in parallel;
 b. means for selecting a particular said channel within said plurality of channel sections, and routing an electrical signal delivered to its channel input to its channel output; and,
 c. a plurality of pairs of common-base amplifiers, each of said pair of common-base amplifiers having emitter inputs connected to said parallel outputs of a respective channel section, each of said pair of common-base amplifiers having respective collector outputs, said outputs of said plurality of pairs of common-base amplifiers being connected in parallel to provide a multiplexer output.

13. A multiplexer as in claim 12, further including means for reducing signal jitter at said emitter inputs of said first and second pairs of common-base amplifiers.

14. A multiplexer as in claim 12 in which said means for reducing jitter comprises a bleeder current source which establishes a minimum base-emitter junction voltage for said common-base amplifiers.

15. A multiplexer as in claim 14 in which said minimum base-emitter junction voltage is selected so that a settling voltage for an electrical signal of long duration is substantially the same as that for an electrical signal of short duration.

16. A multiplexer as in claim 12 in which said outputs of said common-base amplifiers are connected to a pair of emitter-follower amplifiers.

17. A multiplexer as in claim 12 in which a predetermined ratio exists between the number of said common-base transistors and the number of channels in each said channel sections, said predetermined ratio being selected so that the ratio of said common-base amplifiers for a channel section to the number of channels within said channel section, is approximately the same as the ratio between an impedance at said emitter input of said common-base amplifiers to an impedance at said output of said common-base amplifiers.

18. A multiplexer as in claim 17 in which said ratio is selected to fall within a range of 4:15, 5:12, or 6:10.

19. A multiplexer as in claim 12 in which said means for selecting a particular said channel within said first or said second channel section includes a plurality of switchable current sources within each of said channels.

20. A multiplexer as in claim 19 in which each of said switchable current sources within each of said channels is interconnected to a respective select line input, and further including a decoder having a plurality of outputs connected to each of said respective select line inputs.

21. A multiplexer as in claim 12 including four of said channel sections, and in which each of said channel sections includes seventeen of said channels.

22. A multiplexer as in claim 12 in which at least one of said channels includes an input buffer and an output Ft-doubler.

* * * * *